(12) United States Patent
Haitani

(10) Patent No.: US 6,754,028 B2
(45) Date of Patent: Jun. 22, 2004

(54) CONTROL INTEGRATED CIRCUIT FOR FLOPPY DISK DRIVE

(75) Inventor: Munehisa Haitani, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 459 days.

(21) Appl. No.: 09/946,087

(22) Filed: Sep. 4, 2001

(65) Prior Publication Data

US 2002/0027737 A1 Mar. 7, 2002

(30) Foreign Application Priority Data

Sep. 5, 2000 (JP) ........................................ 2000-268996

(51) Int. Cl.$^7$ ............................ G11B 21/02; G11B 5/596
(52) U.S. Cl. ........................ 360/75; 360/78.13; 360/86; 360/244.1
(58) Field of Search .............................. 360/75, 78.13, 360/86, 244.1

(56) References Cited

FOREIGN PATENT DOCUMENTS

JP         7-272398         10/1995

*Primary Examiner*—David Hudspeth
*Assistant Examiner*—Jason Olson
(74) *Attorney, Agent, or Firm*—Brinks Hoffer Gilson & Lione

(57) ABSTRACT

A control IC is mounted on a circuit board and is used for driving both a one-inch stepper motor and a half-inch stepper motor. The control IC includes at least a number of pads required for driving the half-inch stepper motor. When the control IC drives the one-inch stepper motor or the half-inch stepper motor, the saturation voltage, the arrangement of the pads having the same functions for driving the one-inch stepper motor and the half-inch stepper motor, and the read/write constants for reading and writing from/into a floppy disk are set to be equal for both the one-inch stepper motor and the half-inch stepper motor.

17 Claims, 2 Drawing Sheets

CONTROL INTEGRATED CIRCUIT FOR FLOPPY DISK DRIVE

BACKGROUND OF THE INVENTION

1. Field of the Invention

The present invention generally relates to a control integrated circuit (control IC) used for floppy disk drives (FDD), and more particularly to an FDD control IC which can be used for driving both a stepper motor used in a one-inch-thick FDD and a stepper motor used in a half-inch-thick FDD.

2. Description of the Related Art

Generally, in one-inch-thick FDDs used in desk-top personal computers, a large stepper motor (hereinafter referred to as a "one-inch stepper motor") is used for moving a head to a predetermined position of a floppy disk because of the comparatively large space inside the casing of the personal computer. In contrast, in half-inch-thick FDDs used in notebook-type personal computers, a small stepper motor (hereinafter referred to as a "half-inch stepper motor") is used because of the comparatively small space inside the casing of the personal computer.

The stepper motors used in the FDDs are driven by a control IC, which is mounted on a circuit board provided within the casing of the personal computer. Generally, the saturation voltage $V_{sat}$ of the one-inch stepper motor is different from that of the half-inch stepper motor. Additionally, the number of signals for an interface required for driving the half-inch stepper motor is slightly greater than that of the one-inch stepper motor. Accordingly, a greater number of pins should be disposed on the circuit board. More specifically, the number of pins provided on the circuit board for driving the one-inch stepper motor is 44, while the number of pins for driving the half-inch stepper motor is 48. Thus, because of the difference in the number of pins, the number of pads provided for a control IC for driving the one-inch stepper motor is different from the number of pads for driving the half-inch stepper motor. More specifically, 44 pads are required for a control IC for driving the one-inch stepper motor, while 48 pads are required for a control IC for driving the half-inch stepper motor.

Because of recent remarkable progress in manufacturing techniques, ICs can now be mass produced. Accordingly, the manufacturing cost has become less expensive as has the unit price of the ICs. This is also true for control ICs used in FDDs.

As discussed above, however, different FDD control ICs are used for driving the one-inch stepper motor and the half-inch stepper motor. Accordingly, different manufacturing methods are required for manufacturing the FDD control ICs. Additionally, the production volume for each type of control ICs is limited, thereby increasing the manufacturing cost on the whole.

In order to solve the above-described problems, the same control IC may be used for driving the one-inch stepper motor and the half-inch stepper motor. However, the seek pattern having a timing for driving the one-inch stepper motor is different from the seek pattern having a timing used for driving the half-inch stepper motor. Thus, it is difficult to obtain a control IC which can be used for driving both the one-inch stepper motor and the half-inch stepper motor so that they can be properly operated.

SUMMARY OF THE INVENTION

Accordingly, in view of the above-described technical background, it is an object of the present invention to provide an FDD control IC which can be used for driving both a one-inch stepper motor and a half-inch stepper motor.

It is another object of the present invention to provide an FDD control IC for driving a one-inch stepper motor and a half-inch stepper motor so that they can be properly operated.

In order to achieve the above objects, according to the present invention, there is provided a control IC mounted on a circuit board, for driving both a one-inch stepper motor used in a FDD and a half-inch stepper motor used in a FDD. The control IC includes at least a number of pads required for driving the half-inch stepper motor. When the control IC drives the one-inch stepper motor or the half-inch stepper motor, the saturation voltage, the arrangement of the pads having the same functions for driving the one-inch stepper motor and the half-inch stepper motor, read/write constants for reading and writing from and into a floppy disk are set to be equal for both the one-inch stepper motor and the half-inch stepper motor.

With this configuration, the one-inch stepper motor and the half-inch stepper motor can be driven in a suitable state. Since the same control IC is used for both types of stepper motors, the production volume of the control ICs can be increased, and the manufacturing cost can also be decreased.

In the aforementioned control IC, the pads may include a detection pad for receiving an intermediate voltage between a power supply voltage and a reference voltage. The detection pad may not be electrically connected to any pin disposed on the circuit board when the control IC is used for driving the one-inch stepper motor, and the detection pad may be electrically connected to a detection pin which is disposed on the circuit board and which is selectively maintained at the power supply voltage or the reference voltage when the control IC is used for driving the half-inch stepper motor.

In this case, the control IC may generate a seek pattern having a timing suitable for the one-inch stepper motor when the voltage of the detection pad is the intermediate voltage, and the control IC may generate a seek pattern having a timing suitable for the half-inch stepper motor when the voltage of the detection pad is the power supply voltage or the reference voltage.

With this arrangement, by detecting the voltage of the detection pad, the control IC is able to instantly determine which type of stepper motor, i.e., the one-inch stepper motor or the half-inch stepper motor, the control IC is driving. Thus, the control IC can generate a seek pattern having a timing suitable for the detected type of stepper motor. As a result, the one-inch stepper motor and the half-inch stepper motor can be driven in a more suitable state.

DESCRIPTION OF THE PREFERRED EMBODIMENTS

The present invention is described in detail below with reference to the accompanying drawings through illustration of preferred embodiments.

Figure 1A:
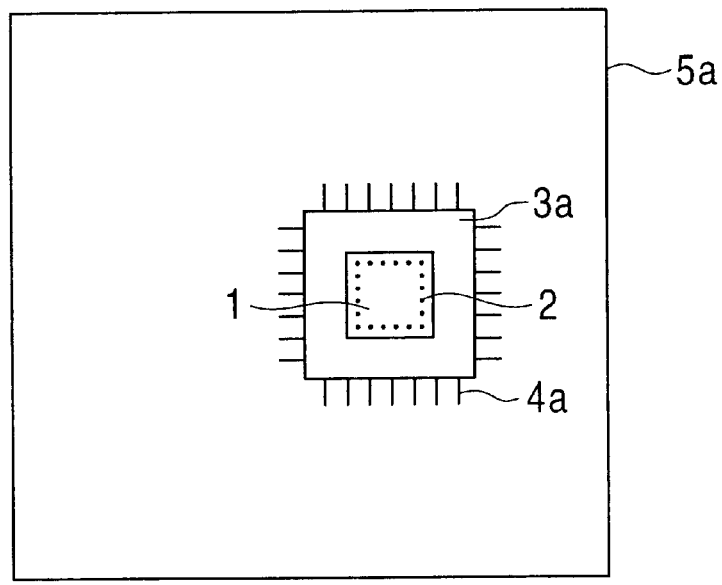
FIGS. 1A and 1B illustrate an FDD control IC according to a first embodiment of the present invention.
Figure 1B:
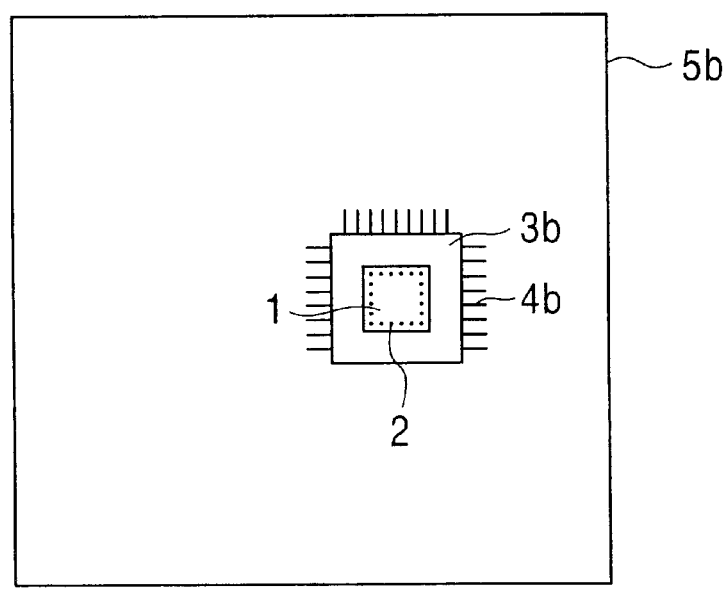

FIGS. 1A and 1B are top views illustrating an FDD control IC mounted on a circuit board according to a first embodiment of the present invention. FIG. 1A illustrates the FDD control IC when it is used for driving a one-inch stepper motor, and FIG. 1B illustrates the FDD control IC when it is used for driving a half-inch stepper motor.

A control IC 1 is used for driving both a one-inch stepper motor and a half-inch stepper motor, and includes, as shown in FIG. 1A, 48 pads 2. When the control IC 1 is used for driving a one-inch stepper motor, it is housed in a large package 3a, and the package 3a is mounted on a circuit board 5a. A suitable number of pins for driving the one-inch stepper motor, for example, 44 pins 4a, are provided on the circuit board 5a, and the pins 4a are electrically connected to the corresponding pads 2.

The control IC 1 shown in FIG. 1B is the same as that shown in FIG. 1A, and has 48 pads 2. When the control IC 1 is used for driving a half-inch stepper motor, it is housed in a small package 3b, and the package 3b is provided on a circuit board 5b. A suitable number of pins for driving the half-inch stepper motor, for example, 48 pins 4b, are provided on the circuit board 5b, and the pins 4b are electrically connected to the corresponding pads 2.

In this case, the control IC 1 is used for driving both the one-inch stepper motor and the half-inch stepper motor. Accordingly, the saturation voltages $V_{sat}$ of the two types of stepper motors are set to be equal, and the arrangement of the pads 2 having the same function for driving the one-inch stepper motor and the half-inch stepper motor is set to be the same. Moreover, the read/write constants used for reading and writing information from/into a floppy disk are set to be the same for both driving the one-inch stepper motor and the half-inch stepper motor.

With this configuration of the control IC 1, the one-inch stepper motor and the half-inch stepper motor can be suitably driven. Thus, the production volume of the control ICs 1 can be increased, and the manufacturing cost can accordingly be decreased.

Figure 2A:
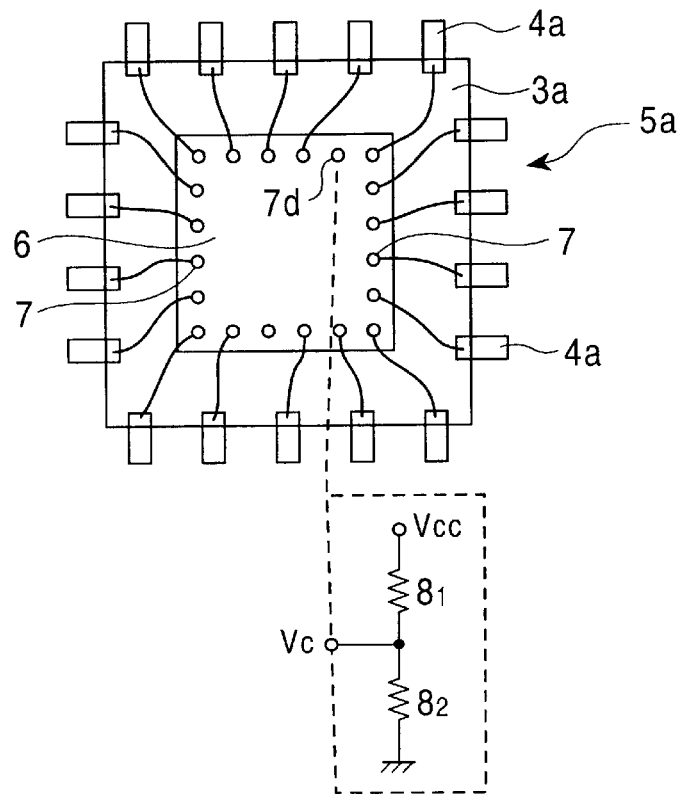
FIGS. 2A and 2B illustrate an FDD control IC according to a second embodiment of the present invention.
Figure 2B:
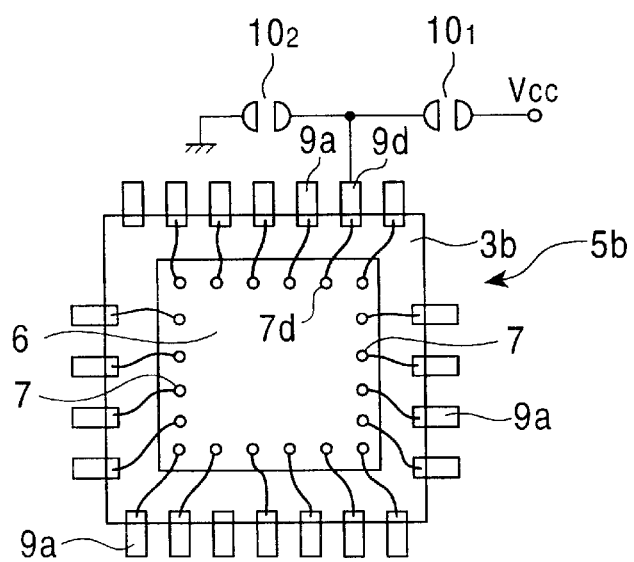

FIGS. 2A and 2B are top views illustrating an FDD control IC according to a second embodiment of the present invention. FIG. 2A illustrates the FDD control IC housed in a package on a circuit board when it is used for driving a one-inch stepper motor, and FIG. 2B illustrates the FDD control IC housed in a package on a circuit board when it is used for driving a half-inch stepper motor.

In the second embodiment, when the control IC is mounted on a circuit board, it is possible to automatically determine the type of circuit board, i.e., a circuit board 3a used for driving the one-inch stepper motor or a circuit board 3b used for driving the half-inch stepper motor.

Elements the same as those shown in FIGS. 1A and 1B are designated with like reference numerals.

In one embodiment of automatic recognition, an applied voltage may be used to determine the type of circuit board. As shown in FIG. 2A, a control IC 6 has 47 pads 7 and one detection pad 7d, and a suitable number of pins for driving a one-inch stepper motor, for example, 44 pins 4a are provided on the circuit board 5a. An intermediate voltage $V_c$ between a power supply voltage $V_{cc}$ and a reference voltage is obtained by dividing the power supply voltage $V_{cc}$ by two resistors $8_1$ and $8_2$ having the same resistance within the control IC 6 and is supplied to the detection pad 7d, as indicated by dashed lines of FIG. 2A. When the control IC 6 is used for driving the one-inch stepper motor, the detection pad 7d is not connected to any of the pins 4a and is isolated from an external source. Among the 47 pads 7, the 44 pads 7 are electrically connected to the corresponding pins 4a.

The control IC 6 shown in FIG. 2B is the same as that shown in FIG. 2A. The control IC 6 includes 47 pads 7 and one detection pad 7d, and a suitable number of pins for driving a half-inch stepper motor, for example, 48 pins 9a and one detection pin 9d, are disposed on the circuit board 5b. In this case, the detection pin 9d is connected to a node between selection switches $10_1$ and $10_2$, which are connected to each other in series between the power supply voltage $V_{cc}$ and the reference voltage. By selectively turning off one of the selection switches $10_1$ and $10_2$, the power supply voltage $V_{cc}$ or the reference voltage is supplied to the detection pin 9d. As shown in FIG. 2A, the intermediate voltage $V_c$ is supplied to the detection pad 7d of the control IC 6. When the control IC 6 is used for driving the half-inch stepper motor, the detection pad 7d is electrically connected to the detection pin 9d provided on the circuit board 5b, and the 47 pads 7 are electrically connected to the corresponding pins 9a. In this embodiment, the control IC 6 may distinguish the intermediate voltage $V_c$ from either the power supply voltage $V_{cc}$ or the reference voltage, while the flexibility and ease of device and/or system design is maintained by using a single pair of voltages for the control IC 6 driving the half-inch stepper motor and the control IC 6 driving the one-inch stepper motor.

The control IC 6 constantly monitors the state in which the intermediate voltage $V_c$ is supplied to the detection pad 7d. When the control IC 6 is used for driving the one-inch stepper motor, the detection pad 7d is isolated from an external source. Thus, the control IC 6 can determine that the voltage of the detection pad 7d is maintained at the intermediate voltage $V_c$, and generates a seek pattern having a timing suitable for the one-inch stepper motor. In contrast, when the control IC 6 is used for driving the half-inch stepper motor, the detection pad 7d is electrically connected to the detection pin 9d. Accordingly, the control IC 6 can determine that the voltage of the detection pad 7d is equal to the power supply voltage $V_{cc}$ or the reference voltage, and generates a seek pattern having a timing suitable for the half-inch stepper motor.

As described above, the control IC 6 is able to determine whether it is used for driving the one-inch stepper motor or the half-inch stepper motor by detecting the voltage of the detection pad 7d. Based on the above-described determination, the control IC 6 generates a seek pattern having a timing suitable for the diameter of the stepper motor to be driven, thereby precisely moving the head to a seek position.

As in the control IC 1 of the first embodiment, since the control IC 6 of the second embodiment is used for driving both the one-inch stepper motor and the half-inch stepper motor, the saturation voltages $V_{sat}$ of the two types of stepper motors are set to be equal, and the arrangement of the pads 2 having the same functions for driving the one-inch stepper motor and the half-inch stepper motor is set to be the same. Moreover, the read/write constants for reading and writing information from/into a floppy disk are set to be the same for both the one-inch stepper motor and the half-inch stepper motor.

With this configuration of the control IC 6, the one-inch stepper motor and the half-inch stepper motor can be suitably driven. Thus, the production volume of the control ICs 6 can be increased, and the manufacturing cost can accordingly be decreased.

Although in the first and second embodiments the number of pads of the control IC 1 or 6 is 48, it may be greater than 48.

In addition, the resistors $8_1$ and $8_2$ are not required to have the same resistance. Nor is the reference voltage in either one or both of FIG. 2A or 2B required to be ground. The reference voltage (and Vcc) must merely be different enough from the intermediate voltage such that when the control IC 6 detects the voltage of the detection pad 7d, whether it is used for driving the one-inch stepper motor or the half-inch stepper motor may be determined. In addition, rather than determining the type of control board using the magnitude of the voltage, the polarity of the voltage may be used.

Similarly, selection switches $10_1$ and $10_2$ may be any analog or digital switch known in the art, such a transistor, and may be manually or automatically controlled.

Although voltage has been used to determine the type of circuit board, one skilled in the art may use other electronic signals or characteristics, for example, current or resistance, to determine the type of circuit board. Similarly, digital signals may be used to determine whether one type of circuit board or another is being used.

Many different embodiments of the present invention may be constructed without departing from the spirit and scope of the present invention. It should be understood that the present invention is not limited to the specific embodiments described in this specification. To the contrary, the present invention is intended to cover various modification and equivalent arrangements included within the spirit and scope of the invention as hereafter claimed. The scope of the following claims is to be accorded the broadest interpretation so as to encompass all such modifications, equivalent structures and functions.

What is claimed is:

1. A control integrated circuit mounted on a circuit board, the control integrated circuit to drive both a stepper motor used for a one-inch-thick floppy disk drive and a stepper motor used for a half-inch-thick floppy disk drive, said control integrated circuit comprising at least a number of pads required to drive the stepper motor used for the half-inch-thick floppy disk drive, wherein, no matter which stepper motor is driven by said control integrated circuit, a saturation voltage, an arrangement of said pads having identical functions for driving the stepper motor used for the one-inch-thick floppy disk drive and the stepper motor used for the half-inch-thick floppy disk drive, and read/write constants for reading and writing from and into a floppy disk are equal.

2. A control integrated circuit according to claim 1, further comprising a detection pin disposed on the circuit board and which is selectively maintained at one of the power supply voltage and the reference voltage when said control integrated circuit drives the stepper motor for the half-inch-thick floppy disk drive, wherein said pads comprise a detection pad that receives an intermediate voltage between a power supply voltage and a reference voltage, said detection pad is not electrically connected to any pin disposed on the circuit board when said control integrated circuit drives the stepper motor for the one-inch-thick floppy disk drive, and said detection pad is electrically connected with the detection pin when said control integrated circuit drives the stepper motor for the half-inch-thick floppy disk drive.

3. A control integrated circuit according to claim 2, wherein said control integrated circuit generates a seek pattern having a timing suitable for the stepper motor used for the one-inch-thick floppy disk drive when the voltage of said detection pad is the intermediate voltage, and said control integrated circuit generates a seek pattern having a timing suitable for the stepper motor used for the half-inch-thick floppy disk drive when the voltage of said detection pad is one of the power supply voltage and the reference voltage.

4. A floppy disc drive controller comprising a control integrated circuit to automatically determine a type of circuit board on which the control integrated circuit is mounted and to drive one of a stepper motor for a one-inch-thick floppy disk drive and a stepper motor for a half-inch-thick floppy disk drive accordingly.

5. The floppy disc drive controller according to claim 4, the control integrated circuit comprising at least a number of pads required to drive the stepper motor for the half-inch-thick floppy disk drive.

6. A floppy disc drive controller according to claim 5, wherein the pads comprise a detection pad that receives a signal dependent on the type of circuit board and the control integrated circuit determines the type of circuit board dependent on the signal.

7. A floppy disc drive controller according to claim 6, wherein the signal is a voltage.

8. A floppy disc drive controller according to claim 7, wherein a magnitude of the voltage received by the detection pad differs between a first magnitude associated with driving the stepper motor for the one-inch-thick floppy disk drive and a second magnitude associated with driving the stepper motor for the half-inch-thick floppy disk drive such that a difference between the first and second magnitudes is detectable by the control integrated circuit.

9. A floppy disc drive controller according to claim 6, wherein the detection pad is isolated from the circuit board when the control integrated circuit drives the stepper motor for the half-inch-thick floppy disk drive, and the detection pad is electrically connected with the detection pin when the control integrated circuit drives the stepper motor for the half-inch-thick floppy disk drive.

10. The floppy disc drive controller according to claim 6, wherein a saturation voltage, an arrangement of the pads having identical functions to drive either stepper motor, and constants to read and write from and into a removable memory device are equal no matter which stepper motor is driven.

11. A floppy disc drive controller according to claim 4, wherein the control integrated circuit generates a seek pattern having an appropriate timing for the driven stepper motor dependent on the type of circuit board determined.

12. The floppy disc drive controller of claim 4, wherein a saturation voltage, an arrangement of pads having identical functions to drive either stepper motor, and constants to read and write from and into a removable memory device are equal no matter which stepper motor is driven.

13. A method of controlling a control integrated circuit, the method comprising:
  automatically determining a type of circuit board on which the control integrated circuit is mounted,
  driving one of a stepper motor for a one-inch-thick floppy disk drive and a stepper motor for a half-inch-thick floppy disk drive accordingly, and
  maintaining a constant saturation voltage, an arrangement of pads having identical functions to drive either stepper motor, and equal constants to read and write from and into a removable memory device no matter which stepper motor is driven.

14. The method of claim 13, further comprising receiving a signal dependent on the type of circuit board and determining the type of circuit board dependent on the signal.

15. The method of claim 14, further comprising discriminating between a first magnitude of a received voltage signal associated with driving the stepper motor for the one-inch-thick floppy disk drive and a second magnitude associated with driving the stepper motor for the half-inch-thick floppy disk drive.

16. The method of claim 15, further comprising isolating one of the pads from the circuit board when the voltage having the first magnitude is received and establishing an electrical connection between the one of the pads and the circuit board when the voltage having the second magnitude is received.

17. The method of claim 13, further comprising generating a seek pattern having an appropriate timing for the driven stepper motor dependent on the type of circuit board determined.

* * * * *